(12) United States Patent
Wang et al.

(10) Patent No.: US 12,025,677 B2
(45) Date of Patent: Jul. 2, 2024

(54) BATTERY, ELECTRIC APPARATUS, AND METHOD FOR PREPARING BATTERY

(71) Applicant: CONTEMPORARY AMPEREX TECHNOLOGY CO., LIMITED, Ningde (CN)

(72) Inventors: Yongguang Wang, Ningde (CN); Feng Qin, Ningde (CN); Lei Wang, Ningde (CN); Jinfeng Li, Ningde (CN); Zhanyu Sun, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 0 days.

(21) Appl. No.: 17/854,827

(22) Filed: Jun. 30, 2022

(65) Prior Publication Data
US 2022/0349950 A1  Nov. 3, 2022

Related U.S. Application Data

(63) Continuation of application No. PCT/CN2021/076281, filed on Feb. 9, 2021.

(51) Int. Cl.
*G01R 31/396* (2019.01)
*H01M 10/42* (2006.01)
(Continued)

(52) U.S. Cl.
CPC ...... *G01R 31/396* (2019.01); *H01M 10/4207* (2013.01); *H01M 10/425* (2013.01);
(Continued)

(58) Field of Classification Search
CPC ............. G01R 31/396; H01M 50/213; H01M 10/425; H01M 10/4207; H01M 10/482; H01M 50/566
(Continued)

(56) References Cited

U.S. PATENT DOCUMENTS 7,740,978 B2   6/2010  Hamada et al.
10,811,734 B2  10/2020 Gong et al.
(Continued)

FOREIGN PATENT DOCUMENTS

CN     1795572 A      6/2006
CN   101907497 A     12/2010
(Continued)

OTHER PUBLICATIONS

International Search Report of Application No. PCT/CN2021/076281 mailed Nov. 1, 2021.
(Continued)

*Primary Examiner* — Jonathan G Jelsma
*Assistant Examiner* — Omar M Kekia
(74) *Attorney, Agent, or Firm* — Ladas & Parry LLP

(57) ABSTRACT

Embodiments of this application provide a battery, an electric apparatus, and a method for preparing battery. The battery includes: a plurality of battery cells, where at least two of the battery cells are arranged along a first direction; a sampling part, configured to collect electrical signals from the plurality of battery cells; and a support part, configured to support the sampling part, where the support part is disposed between two adjacent battery cells in the first direction, and is attached to the battery cells. In the technical solution in the embodiments of this application, the sampling part is easy to install, and the sampling part can be prevented from falling off during use of the battery.

13 Claims, 12 Drawing Sheets

(51) Int. Cl.
*H01M 10/48* (2006.01)
*H01M 50/213* (2021.01)
*H01M 50/566* (2021.01)

(52) U.S. Cl.
CPC ....... *H01M 10/482* (2013.01); *H01M 50/213* (2021.01); *H01M 50/566* (2021.01)

(58) Field of Classification Search
USPC .......................................................... 429/186
See application file for complete search history.

(56) References Cited

U.S. PATENT DOCUMENTS

| 2006/0246348 | A1 | 11/2006 | Hamada et al. |
| 2012/0028084 | A1 | 2/2012 | Park et al. |
| 2017/0125855 | A1* | 5/2017 | Gong ................... H01M 10/425 |
| 2018/0294536 | A1* | 10/2018 | Kruszelnicki ....... H01M 50/291 |
| 2022/0069364 | A1* | 3/2022 | Cunningham ...... H01M 10/425 |

FOREIGN PATENT DOCUMENTS

| CN | 106233526 A | 12/2016 |
| CN | 210136929 U | 3/2020 |
| CN | 210136943 U | 3/2020 |
| CN | 210182435 U | 3/2020 |
| EP | 2375471 A2 | 10/2011 |

OTHER PUBLICATIONS

Written Opinion of Application No. PCT/CN2021/076281 mailed Nov. 1, 2021.
Extended European Search Report for EP Application No. 21912312.2, dated Oct. 12, 2023.

* cited by examiner

BATTERY, ELECTRIC APPARATUS, AND METHOD FOR PREPARING BATTERY

CROSS-REFERENCE TO RELATED APPLICATIONS

This application is a continuation of International Patent Application No. PCT/CN2021/076281 filed on Feb. 9, 2021, which is incorporated herein by reference in its entirety.

TECHNICAL FIELD

This application relates to the battery field, and more specifically, to a battery, an electric apparatus, and a method for preparing battery.

BACKGROUND

With continuous development of battery technologies, performance requirements for batteries are getting higher, and the batteries are expected to be designed in consideration of various factors simultaneously. Usually, a plurality of battery cells in a battery need to be sampled for managing each individual battery. However, when a housing of the battery cell includes a non-planar face or an inclined face, it is difficult to dispose a sampling part.

SUMMARY

This application provides a battery, an electric apparatus, and a method for preparing battery, which can attach a support part to a surface of a battery cell to fasten a sampling part.

According to a first aspect, a battery is provided and includes: a plurality of battery cells, where at least two of the battery cells are arranged along a first direction; a sampling part, configured to collect electrical signals from the plurality of battery cells; and a support part, configured to support the sampling part, where the support part is disposed between two adjacent battery cells in the first direction, and is attached to the battery cells.

In the technical solution in embodiments of this application, the sampling part is supported by the support part, which can not only resolve a problem that the sampling part is difficult to install because of the non-planar or inclined structure on the battery cell, but also improve the sampling stability and reduce falling-off of the sampling part during battery use due to installation on the uneven face.

In some embodiments, an accommodating portion is formed between the two adjacent battery cells in the first direction, and at least part of the support part is accommodated in the accommodating portion. In some embodiments, at least one of the two adjacent battery cells in the first direction has an inclined face or an arc-shaped face in the first direction, and the inclined face or the arc-shaped face forms the accommodating portion. Therefore, the support part is disposed in the accommodating portion between adjacent battery cells, allowing the support part to be reliably attached and saving space.

In some embodiments, the support part extends along a second direction, and the second direction intersects with the first direction; and a height of the support part in a third direction does not exceed a height of the battery cell in the third direction, and the third direction is perpendicular to the first direction and the second direction. As a result, the sampling part can be used to sample battery cells at different locations in the second direction. Moreover, the height of the support part does not exceed the height of the battery cell, which can prevent the support part from protruding from the battery cell and affecting assembling of another component.

In some embodiments, the support part has a top face and a pair of side faces, and the pair of side faces is connected to two sides of the top face in the first direction; and the pair of side faces is respectively attached to the two adjacent battery cells in the first direction.

In some embodiments, at least part of a contour of the side faces matches at least part of a contour of the respective attached battery cells. As a result, a contact area between the support part and the battery cell can be increased, and attachment strength is increased, thereby reducing relative displacement between the battery cells.

In some embodiments, the pair of side faces has first planes and second planes respectively, the first planes intersect with the second planes, and the first planes and the second planes are separately in contact with the respective attached battery cells. As a result, attachment force can be provided for the battery cell and the support part in different directions, thereby further increasing attachment strength and reducing relative displacement between the battery cells.

In some embodiments, the support part is adhered to the battery cell. As a result, the support part can be more firmly fastened.

In some embodiments, the sampling part includes: a sampling connector, where an end of the sampling connector is connected to the battery cell, and the sampling connector is configured to collect an electrical signal from the connected battery cell; and a sampling circuit portion, arranged on the support part, where the sampling circuit portion extends along the second direction, and is configured to transmit the electrical signal in the second direction, the second direction intersects with the first direction, the sampling circuit portion has at least one connection portion, and the connection portion is electrically connected to the other end of the sampling connector.

In some embodiments, the sampling connector includes a temperature sensor, and the temperature sensor is sandwiched between the support part and the battery cell. As a result, temperature of the battery cell can be accurately measured without a need to dispose another component to fasten the temperature sampling part.

In some embodiments, the battery cell includes an end cover and an electrode terminal, the end cover is disposed at an end of the battery cell in the second direction, and the electrode terminal is disposed on the end cover and protrudes in a direction leaving an interior of the battery cell; and the end of the sampling connector is connected to the electrode terminal of the battery cell.

In some embodiments, the electrode terminal includes two end faces and a peripheral side face, the two end faces are arranged along the second direction, the peripheral side face is connected to the two end faces, the end of the sampling connector is connected to the peripheral side face, and connection portions of the electrode terminal and the sampling connector are flat surfaces. The connection portions of the electrode terminal and the sampling connector are set to be flat, which ensures the stable connection between the electrode terminal and the sampling connector, thereby reducing separation between the electrode terminal and the sampling connector caused by the small connection area and low connection strength between them due to the non-planar connection portions.

In some embodiments, the plurality of battery cells form a battery cell array arranged in the first direction and the second direction, and the sampling connector is electrically connected to electrode terminals of two or more adjacent battery cells in the first direction. As a result, not only potentials of the plurality of electrode terminals can be monitored, but also potentials of the plurality of electrode terminals in contact can be equalized, achieving voltage self-equalization of the plurality of battery cells and improving consistency between the plurality of battery cells.

In some embodiments, the sampling connector forms an arch among electrical connection points, a height of the arch in the third direction does not exceed a height of the battery cell in the third direction, and the third direction is perpendicular to the first direction and the second direction. As a result, the sampling connector has a length margin among electrical connection points, so that the sampling connector is not disconnected due to relative displacement of the components. In addition, the height of the sampling connector is less than the height of the battery cell, which can reduce a possibility that the another component comes into contact with the sampling connector and improve sampling accuracy.

In some embodiments, at least two of the battery cells are arranged in the second direction; two adjacent battery cells in the second direction are electrically connected by welding at least one electrode terminal of the two battery cells; and the sampling connector is connected to a non-welding zone of the electrode terminal. Therefore, when the sampling connector is fastened to the electrode terminal, an adverse effect caused by a mechanical shock or a thermal shock to a welding zone of the electrode terminal during fastening can be reduced, thereby ensuring welding strength at the electrode terminal.

According to a second aspect, an electric apparatus is provided and includes the battery according to the first aspect, where the battery is configured to supply electric energy.

According to a third aspect, a method for preparing a battery is provided and includes: providing a plurality of battery cells, where at least two of the battery cells are arranged along a first direction; providing a sampling part, configured to collect electrical signals from the plurality of battery cells; and providing a support part, configured to support the sampling part, where the support part is disposed between two adjacent battery cells in the first direction, and is attached to the battery cells.

BRIEF DESCRIPTION OF DRAWINGS

The accompanying drawings described herein are intended for a further understanding of this application and constitute a part of this application. Example embodiments of this application and descriptions thereof are intended to explain this application, and do not constitute any inappropriate limitation on this application. In the accompanying drawings.

DESCRIPTION OF EMBODIMENTS

Figure 1:
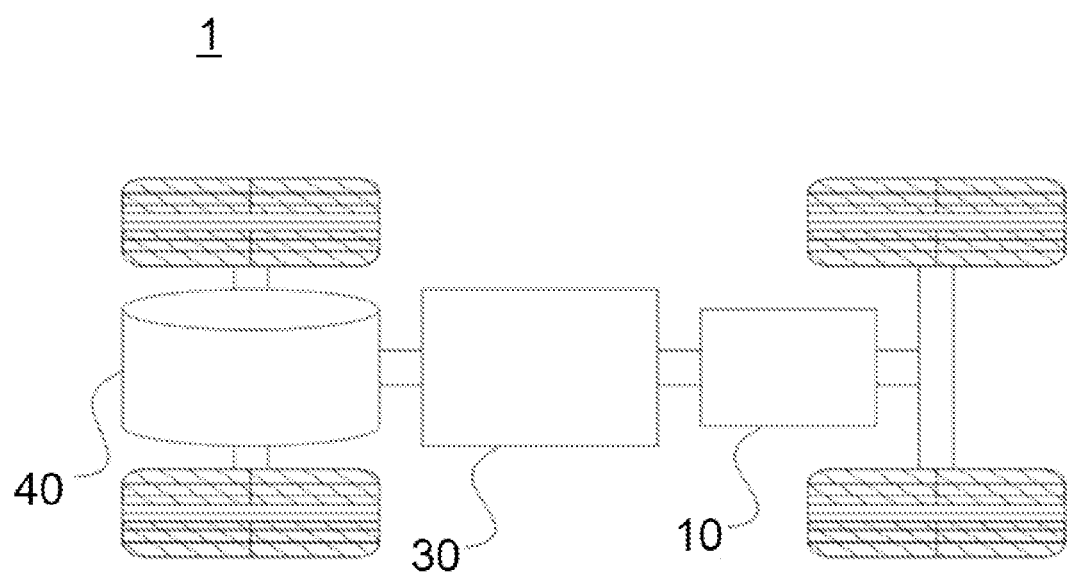
FIG. 1 is a schematic structural diagram of some embodiments of a vehicle using a battery according to this application.

To make the objectives, technical solutions, and advantages of this application clearer, the following clearly describes the technical solutions in the embodiments of this application with reference to the accompanying drawings showing the plurality of embodiments of this application. It should be understood that the described embodiments are only some but not all of the embodiments of this application. All other embodiments obtained by a person of ordinary skills in the art based on the recorded embodiments of this application without creative efforts shall fall within the protection scope of this application.

Unless otherwise defined, all technical and scientific terms used in this application shall have the same meanings as commonly understood by a person skilled in the art to which this application pertains. In this application, the terms used in this specification of this application are only used to describe specific embodiments, and are not intended to limit this application. The terms "include", "comprise", "there be", "have", "contain", and "with" in this specification, claims, and description of accompanying drawings of this application are inclusive terms. Therefore, if a method or an apparatus "includes", "comprises", or "has", for example, one or more steps or elements, the method or the apparatus contains the one or more steps or elements, but is not limited to the one or more steps or elements. In the specification, claims, or accompanying drawings of this application, the terms "first", "second", and the like are intended to distinguish between different objects but do not indicate a particular order or a subordinate relationship. In addition, the terms "first" and "second" are merely intended for a purpose of description, and shall not be understood as an indication or implication of relative importance or implicit indication of the number of indicated technical features. Therefore, a feature limited by "first" or "second" may explicitly or implicitly include one or more features. In the descriptions of this application, unless otherwise stated, "a plurality of" means at least two.

In the descriptions of this application, it should be understood that the orientations or positional relationships indicated by the terms "center", "transverse", "length", "width", "upper", "lower", "front", "rear", "left", "right", "vertical", "horizontal", "top", "bottom", "inside", "outside", "axial direction" "radial direction", "circumferential direction", and the like are based on the orientations or positional relationships shown in the accompanying drawings, are merely intended to facilitate the descriptions of this application and simplify the descriptions, are not intended to indicate or imply that the apparatuses or components mentioned in this application must have specific orientations, or be constructed and operated for a specific orientation, and therefore shall not be construed as a limitation to this application.

In the descriptions of this application, it should be noted that unless otherwise specified and defined explicitly, the terms "installment", "link", "connection", and "attachment" should be understood in their general senses. For example, the terms may be a fixed connection, a detachable connection, or an integrated connection, or may be a direct connection, an indirect connection through an intermediate medium, or an internal connection between two elements. A person of ordinary skills in the art can understand specific meanings of these terms in this application based on specific situations.

An "embodiment" mentioned in this application means that specified features, structures, or characteristics described with reference to this embodiment may be included in at least one embodiment of this application. When used in various parts in this specification, the phrase neither necessarily refers to the same embodiment nor refers to an independent or alternate embodiment mutually exclusive with other embodiments. A person skilled in the art can clearly and implicitly understand that the embodiments described in this application can be combined with another embodiment.

As mentioned above, it should be noted that when used in this specification, the term "include/contain" is used to clearly indicate existence of the feature, integer, step, or component, but does not exclude existence or addition of one or more other features, integers, steps, or components or sets of features, integers, steps, or components. As used in this application, singular forms "one", "a" and "the" also include plural forms, unless otherwise clearly dictated in the context.

The terms "a" and "one" in this specification can mean a single one, but can also have the same meaning as "at least one" or "one or more". The term "approximately" generally means a mentioned value plus or minus 10%, or more specifically the mentioned value plus or minus 5%. The term "or" used in the claims means "and/or" unless it is clearly stated that the term "or" only refers to an alternative solution.

The term "and/or" in this application describes only an association relationship for describing associated objects and represents that three relationships may exist. For example, A and/or B may represent the following three cases: A alone, both A and B, and B alone. In addition, the character "I" in this application generally indicates an "or" relationship between the associated objects.

The batteries mentioned in the art can be classified into primary batteries and rechargeable batteries based on whether the batteries are rechargeable. Primary batteries are commonly known as "disposable" batteries or primary cells, because the batteries cannot be recharged and can only be discarded after the power runs out. Rechargeable batteries are also referred to as secondary batteries, secondary cells, or storage batteries. A material and process for manufacturing the rechargeable battery are different from those for manufacturing the primary battery. Advantages of the rechargeable battery are that the rechargeable battery can be used cyclically for a plurality of times after being charged, and has a larger output current load capacity than most primary batteries. Currently, common types of rechargeable batteries include: lead-acid battery, nickel-hydrogen battery, and lithium-ion battery. The lithium-ion battery has advantages such as light weight, large capacity (the capacity is 1.5 to 2 times that of the nickel-hydrogen battery of the same weight), and no memory effect, and has a very low self-discharge rate. Therefore, despite its relatively high price, the lithium-ion battery has still been widely applied. The lithium-ion battery is also applied to battery electric vehicles and hybrid electric vehicles. A lithium-ion battery used for this purpose has a relatively low capacity but greater output and charging currents. Some have longer service life, and the cost is higher.

The battery described in the embodiments of this application is a rechargeable battery. The following mainly uses the lithium-ion battery as an example to describe an idea of this application. It should be understood that any other proper types of rechargeable batteries are applicable.

The battery mentioned in the embodiments of this application is an individual physical module that includes one or more battery cells for providing a higher voltage and capacity. For example, the battery mentioned in this application may include a battery module, a battery pack, or the like. The battery cell includes a positive electrode plate, a negative electrode plate, an electrolyte, and a separator, and is a basic structural unit that forms the battery module and the battery pack. Based on packaging methods, battery cells are generally classified into three types: a cylindrical battery cell, a square battery cell, and a soft-packed battery cell.

Working of the lithium-ion battery cell mainly relies on migration of lithium ions between the positive electrode plate and the negative electrode plate. The lithium-ion battery cell uses an inserted lithium compound as an electrode material. Currently, main common materials used for a positive electrode of the lithium-ion battery include: lithium cobalt oxide ($LiCoO_2$), lithium manganate oxide ($LiMn_2O_4$), lithium nickel oxide ($LiNiO_2$), and lithium iron phosphate ($LiFePO_4$). The separator is disposed between the positive electrode plate and the negative electrode plate to form a film structure with three layers of materials. The film structure is usually wound or laminated to form an electrode assembly in a desired shape. For example, a film structure with three layers of materials in a cylinder-shaped battery cell is wound into a cylinder-shaped electrode assembly, and a film structure in a square-shaped battery cell is approximately wound or laminated into a cuboid-shaped electrode assembly.

A plurality of battery cells can be connected in series and/or in parallel through the electrode terminal for various application scenarios. In some high-power application scenarios such as an electric vehicle, the application of the battery includes three levels: a battery cell, a battery module, and a battery pack. The battery module is formed by electrically connecting a specific quantity of battery cells and putting the battery cells into a frame to protect the battery cells from external impact, heat, vibration, and the like. The battery pack is a final state of a battery system installed in the electric vehicle. Most existing battery packs are manufactured by installing various control and protection systems such as a battery management system (BMS) and a thermal management component on one or more battery modules. With development of technologies, the level of battery module can be omitted, that is, battery cells directly form the battery pack. With this improvement, weight energy density and volumetric energy density of the battery system are increased while a quantity of components is significantly reduced. The battery mentioned in this application includes a battery module or a battery pack.

In addition, during actual application, there are small differences between specific parameters (such as a voltage, internal resistance, and an SOC (state of charge)) of the battery cells, and consequently, differences between the battery cells are increasingly bigger over time. If these differences are neglected, severe consequences and even accidents such as fires and explosions may be caused. Therefore, a battery sampling apparatus is disposed in the battery to promptly discover an abnormality and notify the battery management system to perform corresponding control and processing.

In the prior art, a sampling part for forming a sampling channel is usually disposed outside the battery cell for sampling. The sampling part is, for example, disposed on a housing of the battery cell with a horizontal surface.

However, the prior art has the following problems: when the housing of the battery cell is non-planar or inclined, it is difficult to install and fasten the sampling part to form a stable sampling channel; and during use of the battery, the sampling part is likely to fall off, causing poor sampling stability.

In view of this, this application provides a technical solution. A battery in this application includes: a plurality of battery cells, where at least two of the battery cells are arranged along a first direction; a sampling part, configured to collect electrical signals from the plurality of battery cells; and a support part, configured to support the sampling part, where the support part is disposed between two adjacent battery cells in the first direction, and is attached to the battery cells. The support part is attached to the battery cell, so that even if a housing of the battery cell is non-planar or inclined, the support part and each battery cell can be fastened to positions to prevent the support part from falling off the battery cell. In addition, the sampling part is supported by the support part, which can not only resolve a problem that the sampling part is difficult to install due to the non-planar or inclined structure on the battery cell, but also improve the sampling stability and reduce falling-off of the sampling part during battery use due to installation on the uneven face. In addition, the support part is disposed between the adjacent battery cells, which improves space utilization, thereby increasing the energy density of the battery.

Some embodiments of this application provide an electric apparatus, including a battery, where the battery is configured to supply electric energy. Optionally, the electric apparatus can be a vehicle, a ship, or a spacecraft.

The technical solution described in the embodiments of this application is applicable to various electric apparatuses, such as a mobile phone, a portable device, a notebook computer, an electric bicycle, an electric toy, an electric tool, an electric vehicle, a ship, and a spacecraft. For example, spacecrafts include an airplane, a rocket, a space shuttle, and a spaceship.

It should be understood that the technical solution described in the embodiments of this application is not only applicable to the devices described above, but also applicable to all devices using batteries. However, for brevity of description, in the following embodiments, the electric vehicle is used as an example for description.

For example, FIG. 1 is a schematic structural diagram of a vehicle 1 according to an embodiment of this application. The vehicle 1 may be a fossil fuel vehicle, a natural-gas vehicle, or a new energy vehicle, and the new energy vehicle may be a battery electric vehicle, a hybrid electric vehicle, a range-extended vehicle, or the like. A motor 40, a controller 30, and a battery 10 may be disposed inside the vehicle 1, and the controller 30 is configured to control the battery 10 to supply power to the motor 40. For example, a battery 10 may be disposed at the bottom, the front, or the rear of the vehicle 1. The battery 10 may be configured to supply power to the vehicle 1. For example, the battery 10 may be used as an operational power supply for the vehicle 1, and may be applied to a circuit system of the vehicle 1, for example, may be configured to supply power to meet the start, navigation, and driving requirements of the vehicle 1. In another embodiment of this application, the battery 10 not only can be used as the operational power supply for the vehicle 1, but also can be used as a driving power supply for the vehicle 1, to totally or partially replace the fossil fuel or the natural gas to provide driving power for the vehicle 1.

Based on different power demands, battery cells 20 can be set in any quantity. The plurality of battery cells 20 may be connected in series or in parallel, or through a serial and parallel connection to implement a greater capacity or power. Because each battery 10 may include a large quantity of battery cells 20, for ease of installation, the battery cells 20 may be disposed by group, and each group of battery cells 20 form a battery module. The quantity of battery cells 20 included in the battery module is not limited, and can be set according to requirements.

Figure 2:
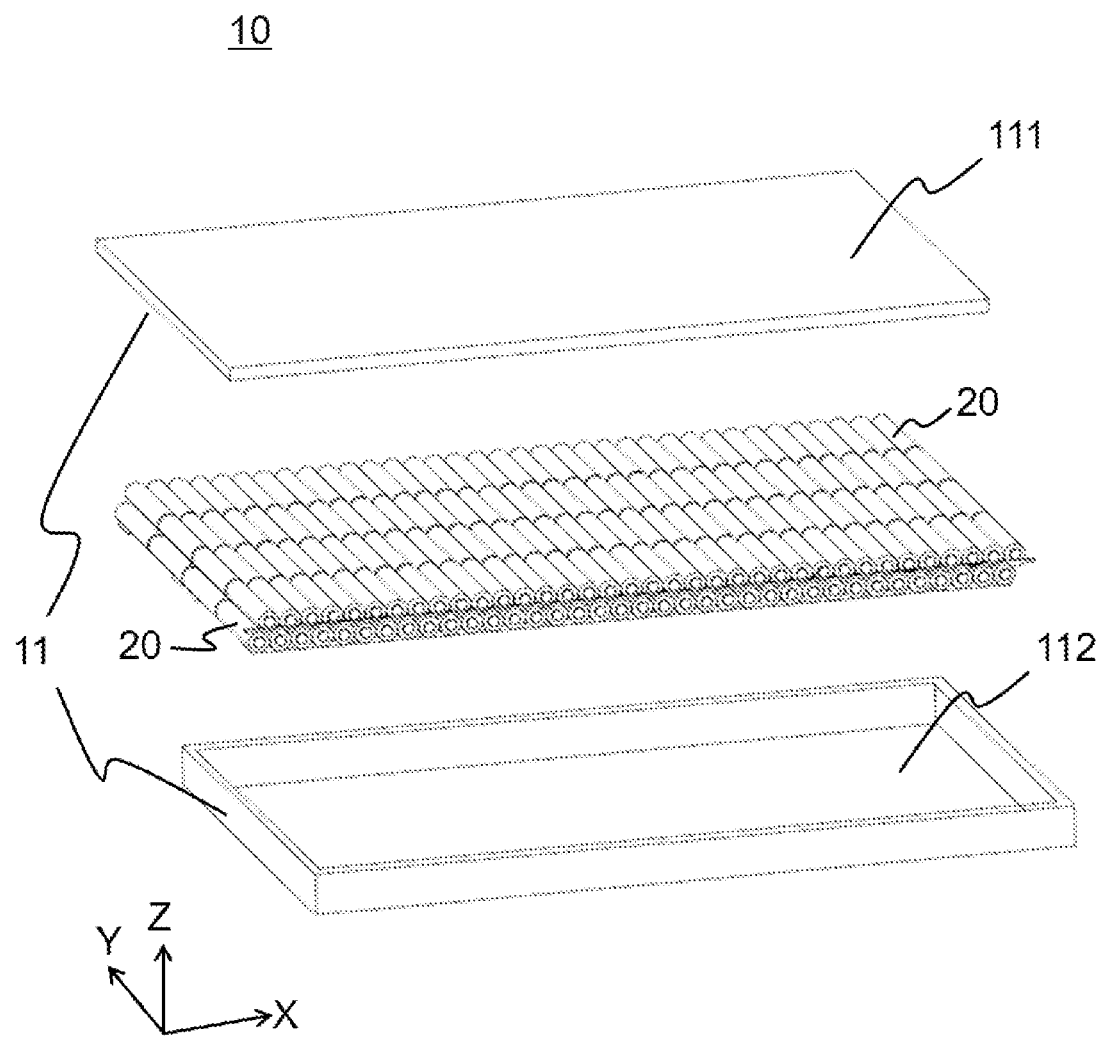
FIG. 2 is a schematic exploded view of a battery according to some embodiments of this application.

FIG. 2 is an exploded view of a battery 10 according to some embodiments of this application. The battery 10 may include a plurality of battery cells 20. The battery 10 may further include a case 11, an inside of the case 11 is a hollow structure, and the plurality of battery cells 20 are accommodated in the case 11. As shown in FIG. 2, the case 11 may include two portions: an upper cover 111 and a box shell 112. The upper cover 111 and the box shell 112 are snap-fitted together. Shapes of the upper cover 111 and the box shell 112 may be determined based on a shape of the plurality of combined battery cells 20, and the upper cover 111 and the box shell 112 each may have an opening. For example, the upper cover 111 and the box shell 112 each may be a hollow cuboid and have only one face with an opening, an opening of the upper cover 111 is disposed opposite an opening of the box shell 112, and the upper cover 111 and the box shell 112 are snap-fitted to form a case with an enclosed chamber. In addition, optionally, one of the upper cover 111 and the box shell 112 may be a cuboid with an opening on a face, and the other may be planar. A plurality of battery cells 20 are connected in parallel, or in series, or in serial-parallel mode, and then put into the case formed after the upper cover 111 and the box shell 112 are snap-fitted together.

Optionally, the battery 10 may further include another structure. Details are not described herein. For example, a multi-layer battery cell assembly is disposed, or a plurality of battery cells form one battery module, and a plurality of battery modules are disposed in the battery, or a busbar, a signal collection harness, a processor, and the like are disposed.

As shown in FIG. 2, a plurality of battery cells 20 may form a battery cell array arranged in a first direction (direction X) and a second direction (direction Y). Herein, the first direction X intersects with the second direction Y, and optionally, the first direction X and the second direction Y are orthogonal. In the first direction X, the plurality of battery cells 20 are arranged side by side, that is, a length direction of each battery cell 20 is perpendicular to the first direction X, and end covers 212 (refer to FIG. 3) of the plurality of battery cells 20 are aligned in the first direction X. In addition, in the second direction Y, the plurality of battery cells 20 are arranged end to end. Specifically, two adjacent battery cells 20 in the second direction Y may be electrically connected by fixedly connecting their respective electrode terminals 214 (refer to FIG. 3). The electrical connection may be a series or parallel connection. When no protruding electrode terminal 214 is provided on the end cover 212 of the battery cell 20, an electrode terminal 214 of one battery cell 20 may be fixedly connected to an end cover 212 of another battery cell 20, or the end covers 212 of the two battery cells 20 are fixedly connected.

Figure 3:
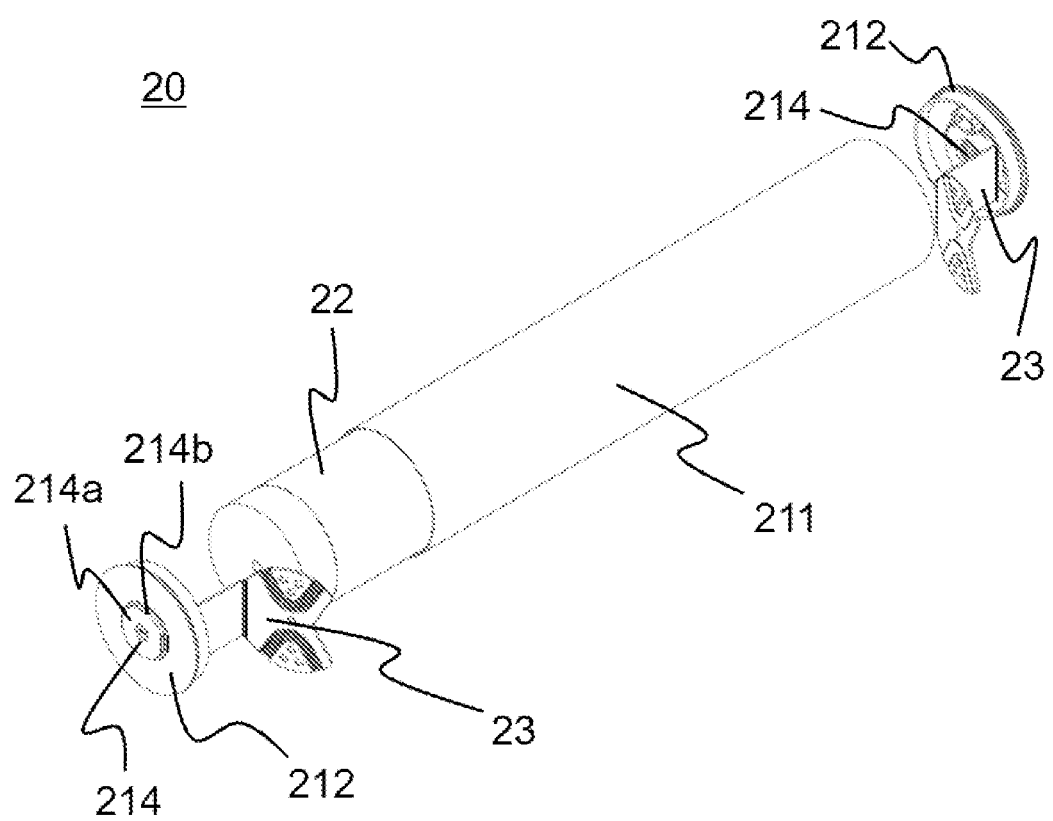
FIG. 3 is a schematic exploded view of a battery cell according to some embodiments of this application.

FIG. 3 is a schematic exploded view of a battery cell according to some embodiments of this application. As shown in FIG. 3, the battery cell 20 may include a housing 211, an end cover 212, and one or more electrode assemblies 22 provided in the housing 211. The housing 211 is determined based on a shape of one or more combined electrode assemblies 22. For example, the housing 211 may be a hollow cuboid, cube, or cylinder, and the housing 211 has an opening so that the one or more electrode assemblies 22 can be put into the housing 211. For example, when the housing 211 is a hollow cuboid or cube, a plane of the housing 211 is a face with an opening, that is, the plane does not have a wall so that the inside and the outside of the housing 211 can communicate without blocking. When the housing 211 can be a hollow cylinder, an end face of the housing 211 is a face with an opening, that is, the end face does not have a wall so that the inside and the outside of the housing 211 can communicate without blocking. The end cover 212 covers the opening and joins the housing 211 to form an enclosed cavity for accommodating the electrode assembly 22. The housing 211 is filled with an electrolyte, such as a liquid electrolyte.

As shown in FIG. 3, the battery cell 20 may further include two electrode terminals 214. The two electrode terminals 214 may be disposed on the end cover 212 and may protrude from the end cover 212 in a direction leaving the interior of the battery cell 20. The end cover 212 is usually planar, and the two electrode terminals 214 are fastened on the planar face of the end cover 212. The electrode terminal 214 may have an end face 214*a* and a peripheral side face 214*b*. Each electrode terminal 214 is provided with a corresponding connection member 23, or a current collection member 23. The connection member 23 is located between the end cover 212 and the electrode assembly 22 and is configured to electrically connect the electrode assembly 22 to the electrode terminal 214. In addition, the electrode terminal 214 may be in various shapes such as a cylinder, a cuboid, a cube, and a polygonal column. In this embodiment, the electrode terminal is in a shape of a cylinder. In addition, the battery cell 20 may be a cuboid, a cube, or a cylinder. In this embodiment, the battery cell 20 is in a shape of a cylinder, with its axis overlapping with an axis of the cylinder-shaped electrode terminal 214.

The two electrode terminals 214 are a positive electrode terminal and a negative electrode terminal respectively. Optionally, it is possible that neither of the two electrode terminals 214 protrude from the end cover 212; or that one electrode terminal 214 protrudes from the end cover 212 and the other electrode terminal 214 does not protrude from the end cover 212. When the electrode terminal 214 does not protrude from the end cover 212, the end cover 212 may directly serve as the electrode terminal 214 to conduct the electric energy from the battery cell 20. In addition, optionally, the battery cell 20 may have only one end cover 212, and the two electrode terminals 214 may be disposed on the same end cover 212.

Figure 4:
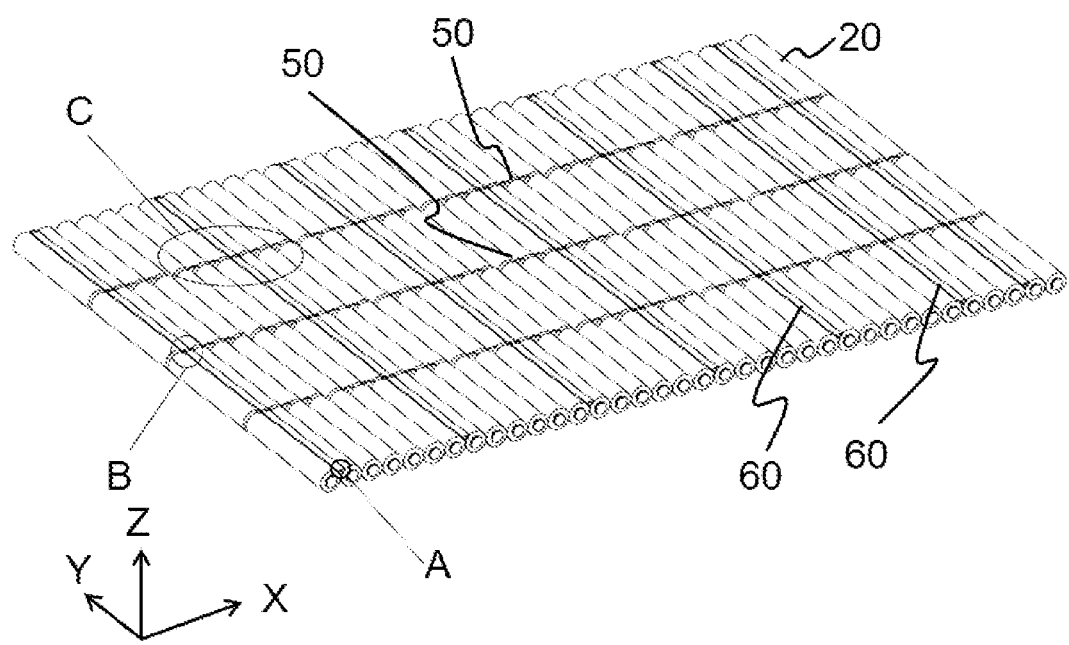
FIG. 4 is a schematic stereogram of a connection relationship between a battery and its support part and sampling part according to some embodiments of this application.

FIG. 4 is a schematic stereogram of a connection relationship between a battery and its support part and sampling part according to some embodiments of this application. As shown in FIG. 4, the battery 10 according to some embodiments of this application includes: a plurality of battery cells 20, arranged along a first direction X; a sampling part 50, configured to collect electrical signals from the plurality of battery cells 20; and a support part 60, configured to support the sampling part 50, where the support part 60 is disposed between two battery cells 20 adjacent along the first direction X, and is attached to the two battery cells 20. The support part 60 is attached to the battery cell 20, so that the support part 60 can be fastened, reducing relative displacement between the battery cell 20 and the support part 60, and preventing the support part 60 from falling off the battery cell 20. In addition, the sampling part 50 is supported by the support part 60, which can not only resolve a problem that the sampling part 50 is difficult to install due to a non-planar or inclined structure on the battery cell 20, but also improve the sampling stability and reduce falling-off of the sampling part 50 during battery use due to installation on the uneven face. In addition, the support part 60 is disposed between the adjacent battery cells 20, which can save the space for arranging the battery cells, thereby improving space utilization and further improving energy density of the battery per unit volume.

Optionally, to further improve the sampling stability of the sampling part 50, the sampling part 50 is fastened to the support part 60. For example, the sampling part 50 may be fastened to the support part 60 through adhesion, riveting, or the like.

Figure 5:
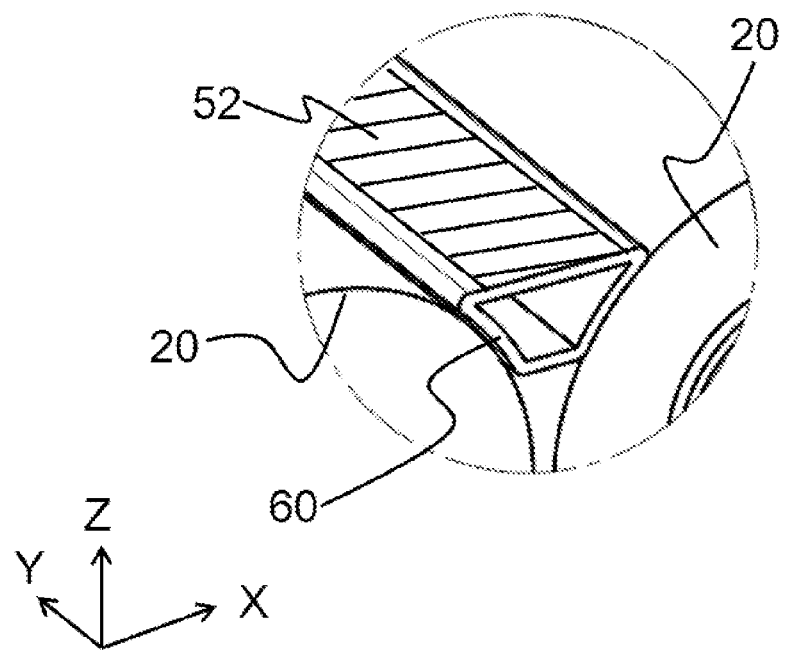
FIG. 5 is an enlarged view of a portion A of the battery shown in FIG. 4.
Figure 6:
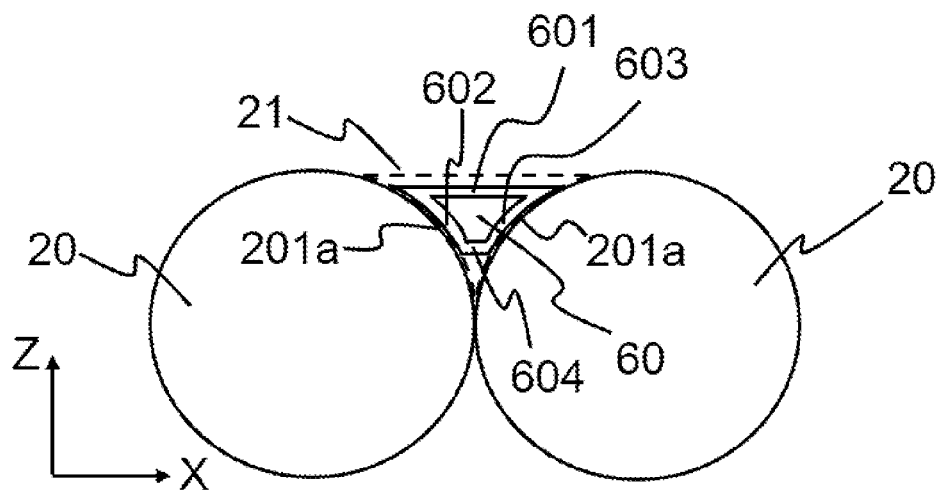
FIG. 6 is a schematic cross-sectional structural diagram of a portion of the battery shown in FIG. 5.

FIG. 5 is an enlarged view of a portion A of the battery shown in FIG. 4. FIG. 6 is a schematic cross-sectional structural diagram of a portion of the battery shown in FIG. 5.

As shown in FIG. 5 and FIG. 6, an accommodating portion 21 (a portion enclosed by a dashed line in FIG. 6) is formed between the two adjacent battery cells 20 in the first direction X, and at least part of the support part 60 is accommodated in the accommodating portion 21. In this embodiment, the battery cell 20 is circular, and a portion between arc-shaped faces 201*a* of the two battery cells 20 in the first direction X form the accommodating portion 21.

In addition, as shown in FIG. 6, the support part 60 has a top face 601 and a pair of side faces 602 and 603, and the pair of side faces 602 and 603 are connected to two sides of the top face 601 in the first direction X, and the pair of side faces 602 and 603 are respectively attached to the two adjacent battery cells 20 in the first direction X. At least part of a contour of the side faces 602 and 603 matches at least part of a contour of the respective attached battery cells 20. For example, in FIG. 6, the side faces 602 and 603 are arc-shaped faces that match the arc-shaped face 201*a* of the battery cell 20. Herein, one of the two adjacent battery cells 20 in the first direction X may have an arc-shaped face, the other may have a flat face, and the accommodating portion can also be formed through such structure. In this way, a contact area between the side faces 602 and 603 and the battery cell 20 is increased, which can increase attachment strength between the support part 60 and the battery cell 20. In addition, the support part 60 may also have a bottom face 604, and the pair of side faces 602 and 603 are connected to two sides of the bottom face 604 in the first direction X.

Figure 7:
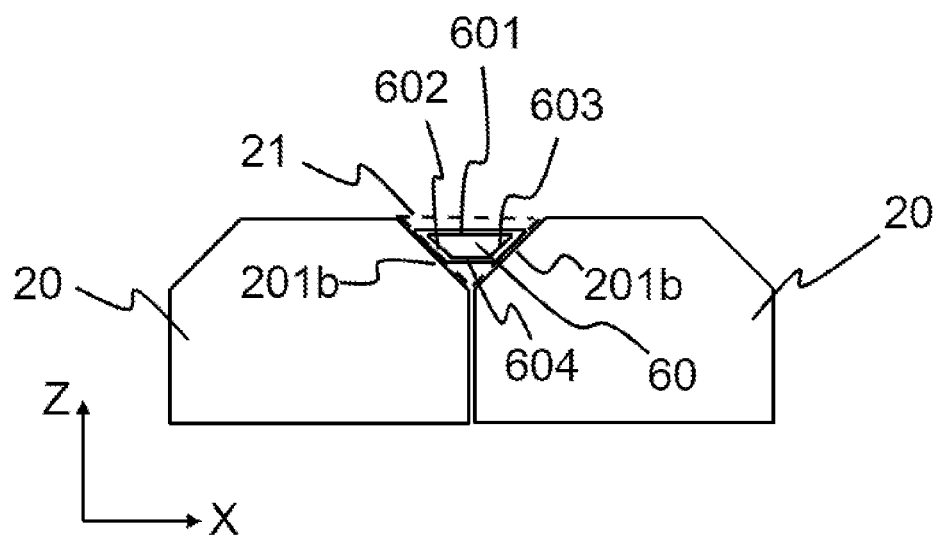
FIG. 7 is a schematic cross-sectional structural diagram of a portion of a battery according to some embodiments of this application.

FIG. 7 is a schematic cross-sectional structural diagram of a portion of a battery according to some embodiments of this application.

As shown in FIG. 7, at least one of the two adjacent battery cells 20 in the first direction X has an inclined face 201b in the first direction X, and the inclined face 201b forms the accommodating portion 21 (a portion enclosed by a dashed line in FIG. 7). In this case, the side faces 602 and 603 are inclined faces that match the inclined face 201b of the battery cell 20. In this way, a contact area between the side faces 602 and 603 and the battery cell 20 can also be increased, thereby increasing attachment strength between the support part 60 and the battery cell 20. In addition, the support part 60 may also have a bottom face 604, and the pair of side faces 602 and 603 are connected to two sides of the bottom face 604 in the first direction X.

As shown in FIG. 6 and FIG. 7, the accommodating portion 21 is formed between the battery cells 20, and the support part 60 is disposed in the accommodating portion 21, thereby saving space. In addition, an attachment face shape of the battery cell 20 matches that of the support part 60, thereby facilitating installation of the support part 60.

In addition, as shown in FIG. 6 and FIG. 7, the support part 60 extends along the second direction Y, a height of the support part 60 in a third direction Z does not exceed a height of the battery cell 20 in the third direction Z, and herein, the third direction Z is perpendicular to the first direction X and the second direction Y. This can further save space, and prevent the support part 60 from protruding from the battery cell 20 and affecting assembling of another component.

Figure 8:
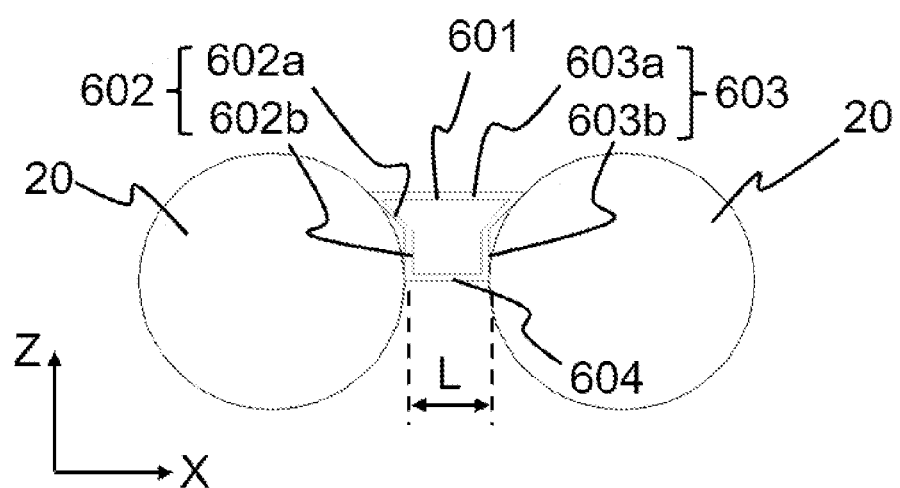
FIG. 8 is a schematic cross-sectional structural diagram of a portion of a battery according to some embodiments of this application.

FIG. 8 is a schematic cross-sectional structural diagram of a portion of a battery according to some embodiments of this application. The support part 60 may have a top face 601 and a pair of side faces 602 and 603, and the pair of side faces 602 and 603 are connected to two sides of the top face 601 in the first direction X. The top face 601 is configured to support the sampling part 50. The pair of side faces 602 and 603 have first planes 602a and 603a, and second planes 602b and 603b. The first plane 602a intersects with the second plane 602b, the first plane 603a intersects with the second plane 603b, and the first planes 602a and 603a and the second planes 602b and 603b are respectively in contact with the respective attached battery cells 20. In this way, the support part 60 and the battery cell 20 can be fastened in a plurality of directions, thereby reducing displacement of the battery cell 20 and the support part 60 in the plurality of directions. In addition, based on requirements, a gap L may be disposed between the battery cells 20, and the gap L may form accommodating space.

Optionally, in some embodiments of this application, the support part 60 is adhered to the battery cell 20. In this way, the support part 60 can be more firmly attached to the battery cell 20, thereby suppressing relative displacement of the components. Herein, the support part 60 may be adhered to the battery cell 20 in the following manner: An adhesive is applied on adhesion faces of the support part 60 and the battery cell 20, and then the corresponding adhesion faces on the battery cell 20 and the support part 60 are adhered together in a surface-adhesion manner through an adhesion force and a cohesive force generated after curing of the adhesive, thereby fastening the battery cell 20 and the support part 60. In this way, the battery cell 20 and the support part 60 can be fastened easily and reliably, with simple processes and low costs. In addition, optionally, the support part 60 may be hollow, so that a weight of the support part 60 can be reduced, thereby improving weight and energy density of the entire battery 10.

Figure 9:
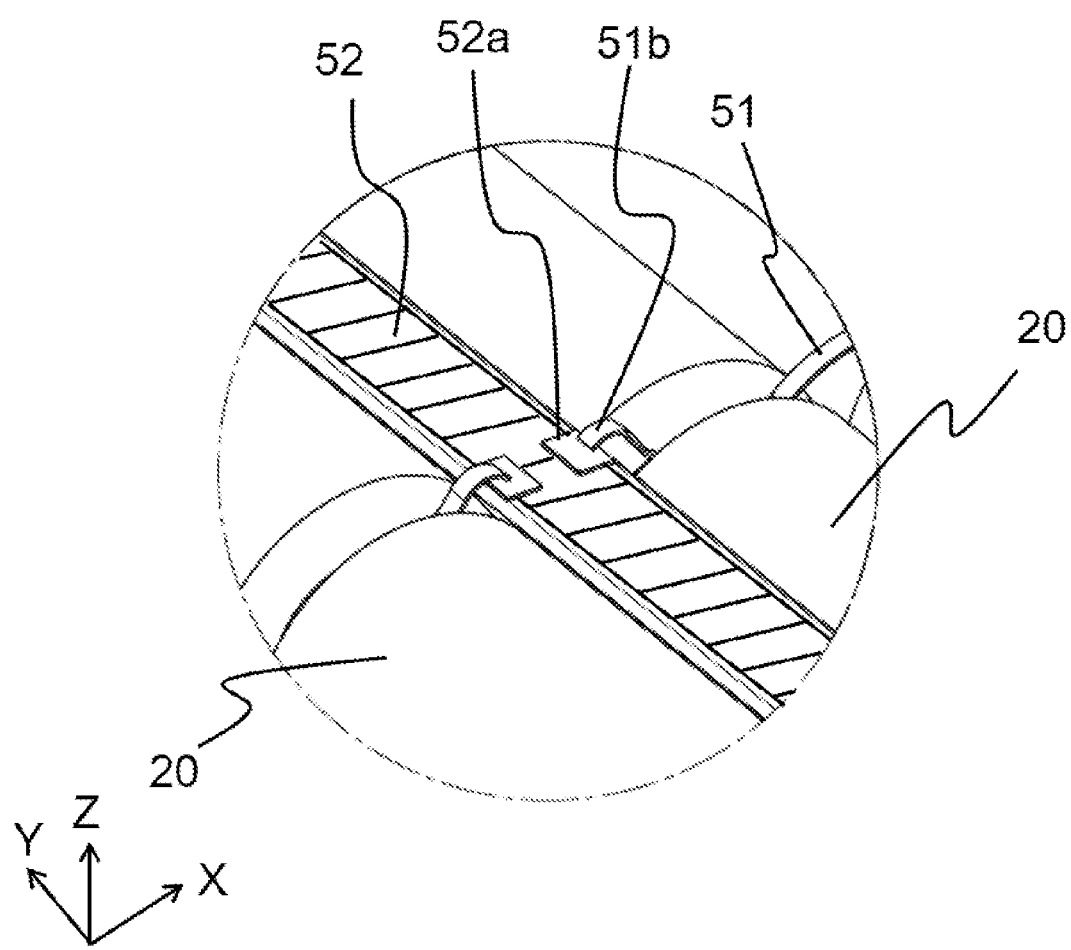
FIG. 9 is an enlarged view of a portion B of the battery shown in FIG. 4.

FIG. 9 is an enlarged view of a portion B of the battery shown in FIG. 5. As shown in FIG. 4, FIG. 5, and FIG. 9, the sampling part 50 includes: a sampling connector 51, where an end 51a (refer to FIG. 11) of the sampling connector 51 is connected to the battery cell 20, and the sampling connector 51 is configured to collect electrical signals from the connected battery cell 20; and a sampling circuit portion 52 (a shaded portion in FIG. 5 and FIG. 9), disposed on the support part 60 and configured to transmit the electrical signal in the second direction Y, where the sampling circuit portion 52 has at least one connection portion 52a, and the connection portion 52a is electrically connected to the other end 51b of the sampling connector 51.

When a plurality of battery cells 20 are arranged in the second direction Y, the sampling connector 51 can be used to collect a signal, and the collected signal can be transmitted through the sampling circuit portion 52. In this way, the plurality of battery cells 20 at different locations in the second direction Y can be sampled by using a simple structure, thereby facilitating management of each battery cell 20 based on the collected signal. In addition, the sampling connector 51 can be disposed between two adjacent battery cells 20 in the second direction Y, thereby improving space utilization.

In addition, optionally, in some embodiments of this application, the sampling circuit portion 52 is a flexible circuit board and is adhered to the top face 601 of the support part 60, and the connection portion 52a is a pad disposed on the flexible circuit board. In this way, the sampling circuit portion 52 can be easily arranged on the support part 60, and a signal transmission circuit can be easily designed and electrically connected to the sampling connector 51 reliably.

Optionally, in some embodiments of this application, the sampling circuit portion 52 may alternatively be a wire or a printed circuit board.

Figure 10:
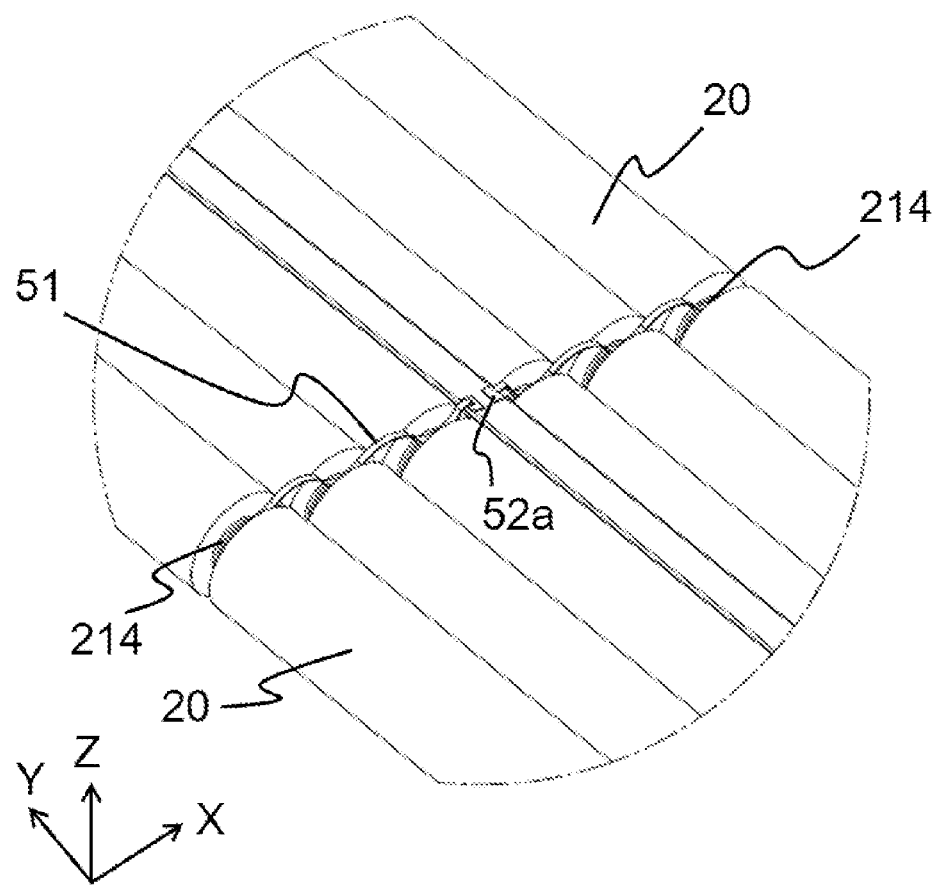
FIG. 10 is an enlarged view of a portion C of the battery shown in FIG. 4.

FIG. 10 is an enlarged view of a portion C of the battery shown in FIG. 5. As shown in FIG. 3 and FIG. 10, the battery cell 20 includes an end cover 212 and an electrode terminal 214, the end cover 212 is disposed at an end of the battery cell 20 in the second direction Y, and the electrode terminal 214 is disposed on the end cover 212 and protrudes in a direction leaving an interior of the battery cell 20. The end 51a of the sampling connector 51 is connected to the electrode terminal 214 of the battery cell 20. In this way, for two battery cells 20 fixedly connected through the electrode terminals 214 in the second direction Y, electrical signals can be collected from the electrode terminals 214 through the sampling connector 51, thereby facilitating management of the battery cells 20.

In addition, optionally, the electrode terminal 214 includes two end faces 214a and a peripheral side face 214b, the two end faces are disposed along the second direction Y, the peripheral side face 214b is connected to the two end faces 214a, and an end of the sampling connector 51 is connected to the peripheral side face 214b. In this way, the sampling connector 51 can use space formed by the peripheral side face 214b and the end face 214a, thereby improving space utilization.

Optionally, connection portions of the electrode terminal 214 and the sampling connector 51 are flat surfaces. Herein, in a case that the connection portions are curved faces, the connection portions can be processed into flat faces. This can ensure a stable connection between the electrode terminal 214 and the sampling connector 51, thereby preventing the sampling connector 51 from falling off the electrode terminal 214. In addition, the sampling connector 51 can alternatively be connected to the electrode terminal 214b through linkage.

Figure 11:
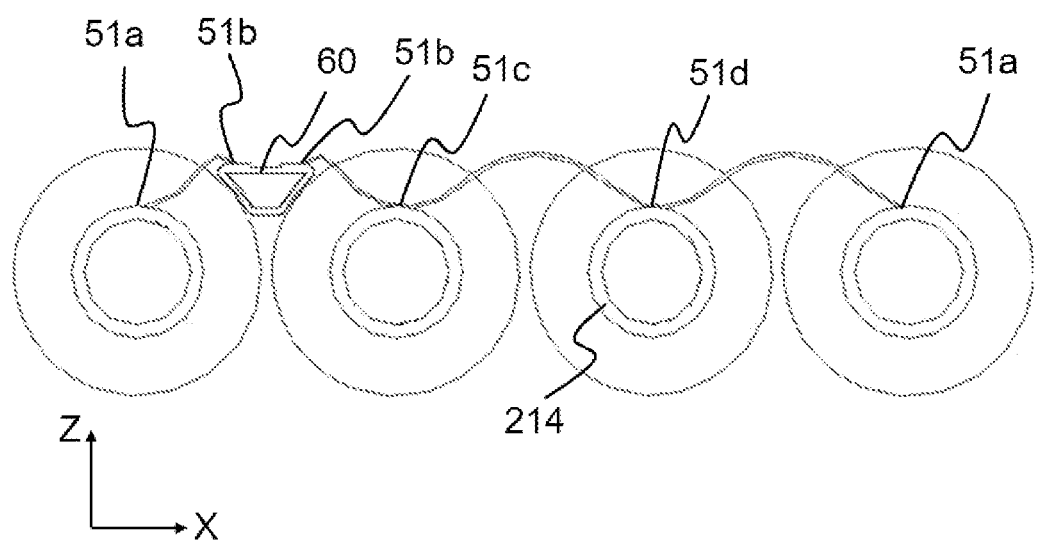
FIG. 11 is a schematic stereogram of a connection relationship between a battery and a sampling connector according to some embodiments of this application.

FIG. 11 is a schematic stereogram of a connection relationship between a battery and a sampling connector according to some embodiments of this application. As shown in FIG. 10 and FIG. 11, the plurality of battery cells 20 are arranged in the first direction X and the second direction Y, and the sampling connector 51 is electrically connected to electrode terminals 214 of two or more adjacent battery cells 20 in the first direction X. In this way, not only potentials of the plurality of electrode terminals 214 can be monitored, but also potentials of the plurality of electrode terminals 214 can be equalized, achieving voltage self-equalization of the plurality of battery cells 20 and improving consistency between the plurality of battery cells 20.

In addition, as shown in FIG. 11, the sampling connector 51 forms an arch between electrical connection points 51a, 51c, and 51d, and a height of the arch in the third direction Z does not exceed a height of the battery cell 20 in the third direction Z. Therefore, the sampling connector 51 has a length margin between the electrical connection points 51a, 51c, and 51d, so that the sampling connector 51 is not disconnected due to relative displacement of the components. In addition, the height of the sampling connector 51 is less than the height of the battery cell 20, which can improve utilization of space for the arranging the battery cell 20, and prevent the arched sampling connector 51 from affecting arrangement of another component, thereby reducing a possibility that the another component comes into contact with the sampling connector 51 and improving sampling accuracy. In addition, optionally, the sampling connector 51 may be a metal belt, for example, an aluminum belt. Therefore, the sampling connector 51 can be easily deformed.

In addition, optionally, in some embodiments of this application, two adjacent battery cells 20 in the second direction Y are electrically connected by welding at least one electrode terminal 214 of the two battery cells 20; and the sampling connector 51 is connected to a non-welding zone of the electrode terminal 214. Herein, the two adjacent battery cells 20 in the second direction Y may be each provided with a protruding electrode terminal 214, and the two electrode terminals 214 may be welded end to end; or one electrode terminal 214 may be connected to another electrode terminal 214 through a connector. Therefore, when the sampling connector 51 is fastened to the electrode terminal 214, an adverse effect caused by a mechanical shock or a thermal shock to a welding zone of the electrode terminal 214 during fastening can be reduced.

In addition, optionally, in some embodiments of this application, a distance between the sampling connector 51 and the connection portion and welding zone of the sampled electrode terminal 214 is greater than 0.5 mm. Therefore, when the sampling connector 51 is fastened to the electrode terminal 214, an adverse effect caused by a mechanical shock or a thermal shock to the welding zone of the electrode terminal 214 during fastening can be further reduced.

Figure 12:
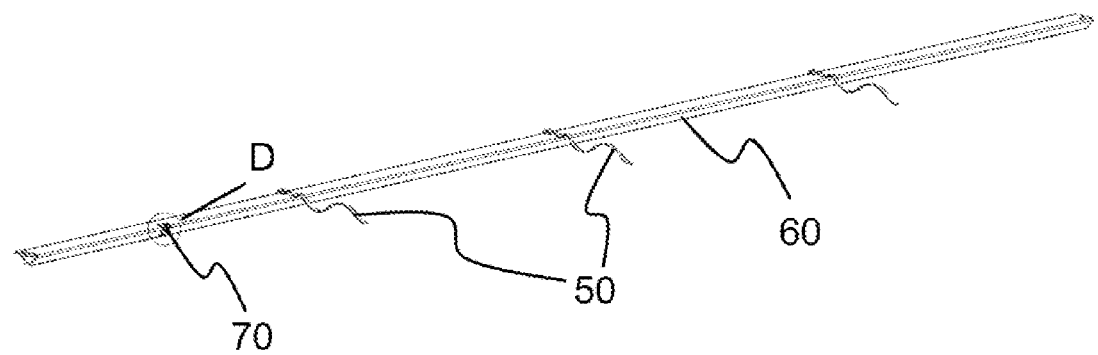
FIG. 12 is a schematic stereogram of a sampling part and a support part of a battery according to some embodiments of this application.
Figure 13:
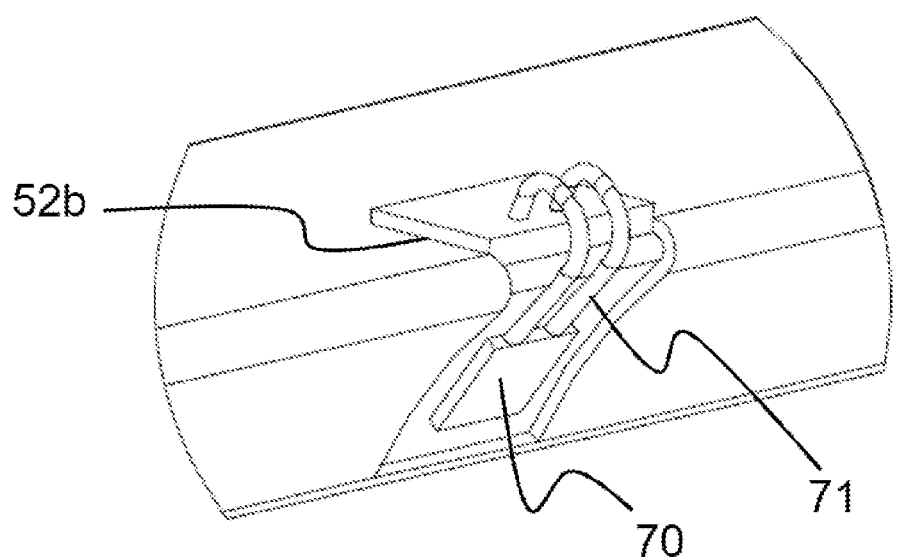
FIG. 13 is an enlarged view of a portion D of the sampling part shown in FIG. 12.
Figure 14:
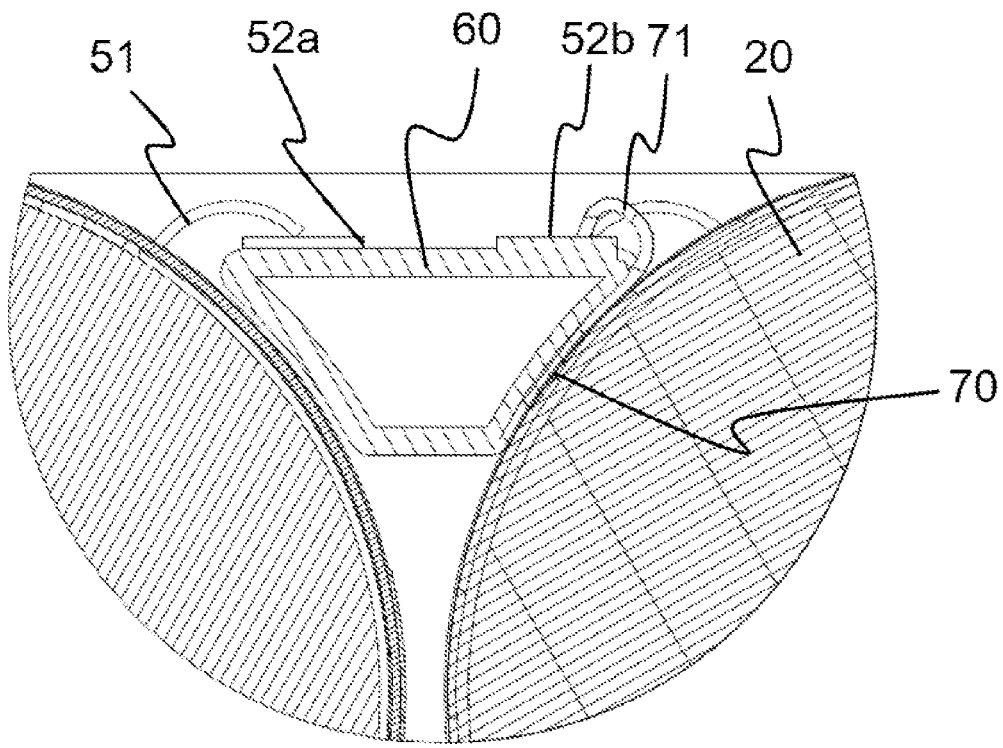
FIG. 14 is a schematic cross-sectional diagram of the battery and the portion of the sampling part shown in FIG. 13.

FIG. 12 is a schematic diagram of a sampling stereogram of a sampling part and a support part of a battery according to some embodiments of this application. FIG. 13 is an enlarged view of a portion D of the sampling part shown in FIG. 12. FIG. 14 is a schematic cross-sectional diagram of a portion of the battery and the sampling part shown in FIG. 13. As shown in FIG. 12 to FIG. 14, the sampling part may include a temperature sensor 70 that is sandwiched between the support part 60 and the battery cell 20. The temperature sensor 70 is, for example, an NTC surface-mount thermistor. The temperature sensor 70 may be connected to a connection portion 52b on the sampling circuit portion 52 through a bent metal part 71. Herein, the connection portion 52b on the sampling circuit portion 52 may be a pad on the flexible circuit board. Therefore, the temperature sensor 70 is directly fastened through the support part 60 without an additional fastening structure. In addition, the temperature sensor 70 is disposed on the battery cell 20, so that temperature of the battery cell 20 can be reliably measured.

Figure 15:
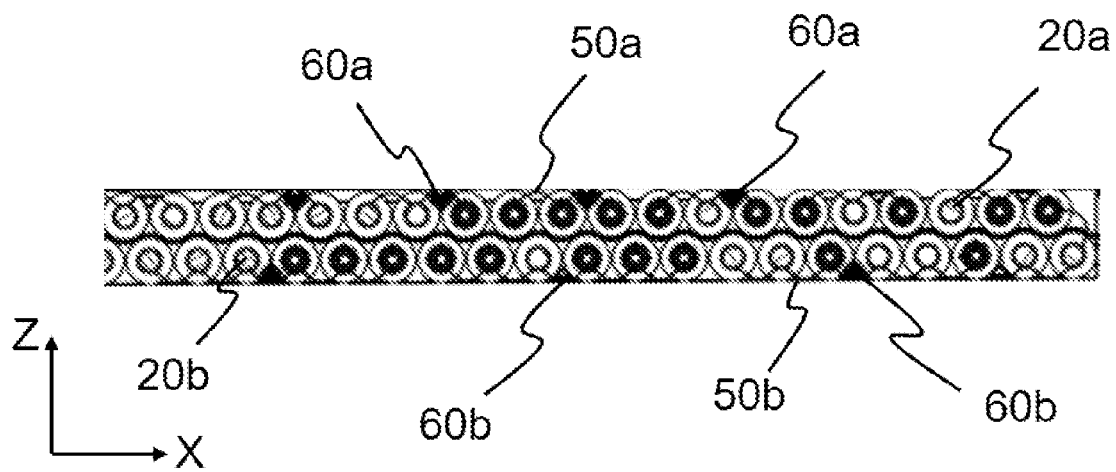
FIG. 15 is a schematic cross-sectional diagram of a battery according to some embodiments of this application.

In addition, FIG. 15 is a schematic cross-sectional diagram of a battery according to some embodiments of this application. As shown in FIG. 3 and FIG. 15, a plurality of battery cells 20 can alternatively form a plurality layers of battery cells 20a and 20b in a third direction Z. As shown in FIG. 15, a support part 60a attached to an upper layer of battery cell 20a is disposed on its attached battery cell 20a on a side of the third direction Z, and a support part 60b attached to a lower layer of battery cell 20b is disposed on its attached battery cell 20b on the other side of the third direction Z. Correspondingly, a sampling part 50a connected to an upper layer of battery cell 20a is disposed on a sampled battery cell 20a on a side of the third direction Z, and a sampling part 50b connected to a lower layer of battery cell 20b is disposed on a sampled battery cell 20b on the other side of the third direction Z. In this way, the support parts 60a and 60b, as well as the sampling parts 50a and 50b, can be separately disposed at different layers, thereby avoiding mutual interference between the support parts 60a and 60b and between the sampling parts 50a and 50b. In addition, because no support parts 60a and 60b or sampling parts 50a and 50b are disposed between two layers of battery cells 20a and 20b, an upper-layer battery cell 20a can be disposed between two adjacent lower-layer battery cells 20b in the first direction X. In this way, the plurality of battery cells 20a and 20b can be arranged more closely.

The battery and the electric apparatus in the embodiments of this application are described above, and a method and apparatus for preparing the battery in the embodiments of this application are described below. For portions that are not described in detail, refer to the foregoing embodiments.

Figure 16:
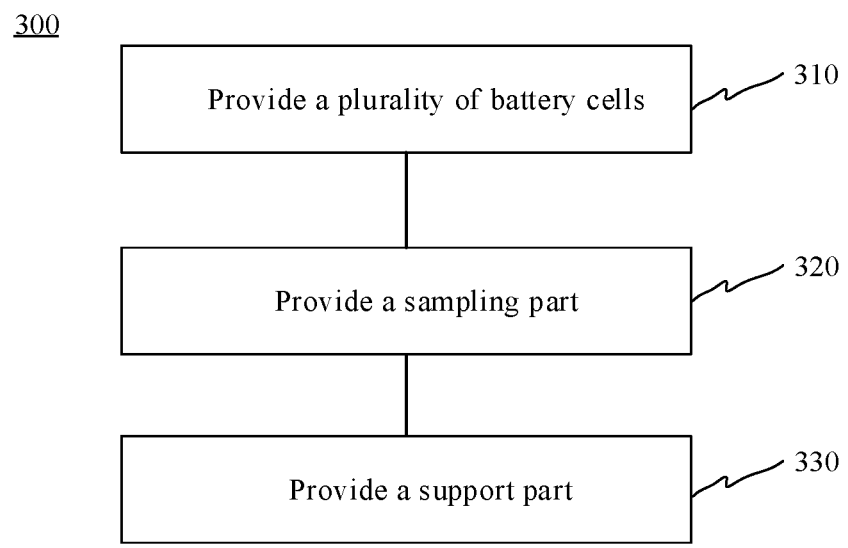
FIG. 16 is a schematic flowchart of a method for preparing a battery according to some embodiments of this application.

FIG. 16 is a schematic flowchart of a method for preparing a battery according to some embodiments of this application. As shown in FIG. 16, the method 300 may include the following steps.

310. Provide a plurality of battery cells 20, where at least two of the battery cells 20 are arranged along a first direction X.

320. Provide a sampling part 50, configured to collect electrical signals from the plurality of battery cells 20.

330. Provide a support part 60, configured to support the sampling part 50, where the support part 60 is arranged between two adjacent battery cells 20 in the first direction X, and is attached to the battery cells 20.

In conclusion, it should be noted that the foregoing embodiments are merely intended for describing the technical solutions of this application, but not for limiting this application. Although this application is described in detail with reference to the foregoing embodiments, persons of ordinary skills in the art should understand that they may still make modifications to the technical solutions described in the foregoing embodiments or make equivalent replacements to some technical features thereof, without departing from the spirit and scope of the technical solutions of the embodiments of this application.

What is claimed is:

1. A battery, comprising:
   a plurality of battery cells arranged in parallel along a first direction, the battery cells being cylindrical in shape;
   an elongated hollow support part disposed along a second direction in one of spaces between two adjacent battery cells, wherein the second direction is perpendicular to the first direction, and wherein the support part comprises a top face and two side faces, the two side faces are respectively connected to two sides of the top face along the second direction, and the two side faces are respectively in contact with the two adjacent battery cells; and
   a sampling part, configured to collect electrical signals from the plurality of battery cells;
   wherein the sampling part comprises a sampling circuit portion and at least one sampling connector, the sampling circuit portion is disposed on the top face of the support part along the second direction; and
   wherein one end of the sampling connector is connected to the sampling circuit portion, and another end of the sampling connector connects to an electrode terminal of an adjacent battery cell and further extends to connect electrode terminals of other battery cells.

2. The battery according to claim 1, wherein at least part of a contour of the side faces matches at least part of a contour of the respective adjacent battery cells.

3. The battery according to claim 1, wherein
   the side faces have first planes and second planes, and the first planes intersect with the second planes; and
   the first planes and the second planes are in contact with the respective adjacent battery cells.

4. The battery according to claim 1, wherein the support part is adhered to the adjacent battery cells.

5. The battery according to claim 1,
   wherein the sampling circuit portion is configured to transmit the electrical signal in the second direction, the sampling circuit portion has at least one connection portion, and the connection portion is electrically connected to the end of the sampling connector.

6. The battery according to claim 5, wherein the sampling connector comprises a temperature sensor, and the temperature sensor is sandwiched between the support part and the battery cell.

7. The battery according to claim 5, wherein
   each battery cell comprises an end cover and an electrode terminal, the end cover is disposed at an end of the battery cell in the second direction, and the electrode terminal is disposed on the end cover and protrudes in a direction leaving an interior of the battery cell; and
   the end of the sampling connector is connected to the electrode terminal of the battery cell.

8. The battery according to claim 7, wherein
   the electrode terminal comprises two end faces and a peripheral side face, the two end faces are arranged along the second direction, the peripheral side face is connected to the two end faces, the end of the sampling connector is connected to the peripheral side face, and connection portions of the electrode terminal and the sampling connector are flat surfaces.

9. The battery according to claim 7, wherein
   the plurality of battery cells form a battery cell array arranged in the first direction and the second direction, and the sampling connector is electrically connected to electrode terminals of two or more adjacent battery cells arranged in the first direction.

10. The battery according to claim 9, wherein
    the sampling connector forms an arch between electrical connection points, a height of the arch in the third direction does not exceed a height of the battery cell in the third direction, and the third direction is perpendicular to the first direction and the second direction.

11. The battery according to claim 7, wherein
    the two adjacent battery cells where the support part is arranged in the second direction are electrically connected by welding at least one electrode terminal of the two battery cells; and
    the sampling connector is connected to a non-welding zone of the electrode terminal.

12. An electric apparatus, comprising the battery according to claim 1, wherein the battery is configured to supply electric energy.

13. A method for preparing a battery, comprising:
    arranging a plurality of battery cells in parallel along a first direction, the battery cells being cylindrical in shape;
    arranging an elongated hollow support part along a second direction in one of spaces between two adjacent battery cells, wherein the second direction is perpendicular to the first direction, and wherein the support part comprises a top face and two side faces, the two side faces are respectively connected to two sides of the top face along the second direction, and the two side faces are respectively in contact with the two adjacent battery cells; and
    arranging a sampling circuit portion of a sampling part on the top face of the support part along the second direction,
    wherein the sampling part further comprises at least one sampling connector, and the sampling part is configured to collect electrical signals from the plurality of battery cells; and
    wherein one end of the sampling connector is connected to the sampling circuit portion, and another end of the sampling connector connects to an electrode terminal of an adjacent battery cell and further extends to connect electrode terminals of other battery cells.

* * * * *